RADIO FREQUENCY TUNING DEVICE
Filed July 31, 1964 3 Sheets-Sheet 1
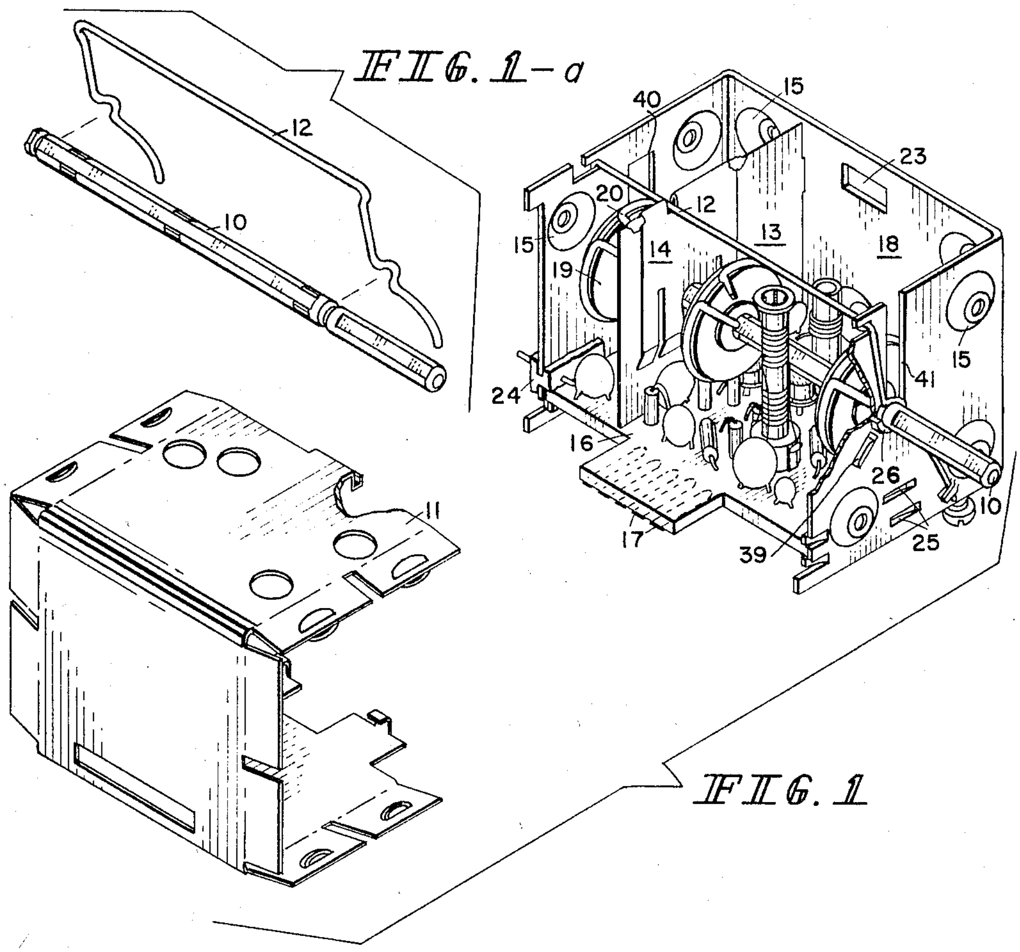
FIG. 1-a, FIG. 1
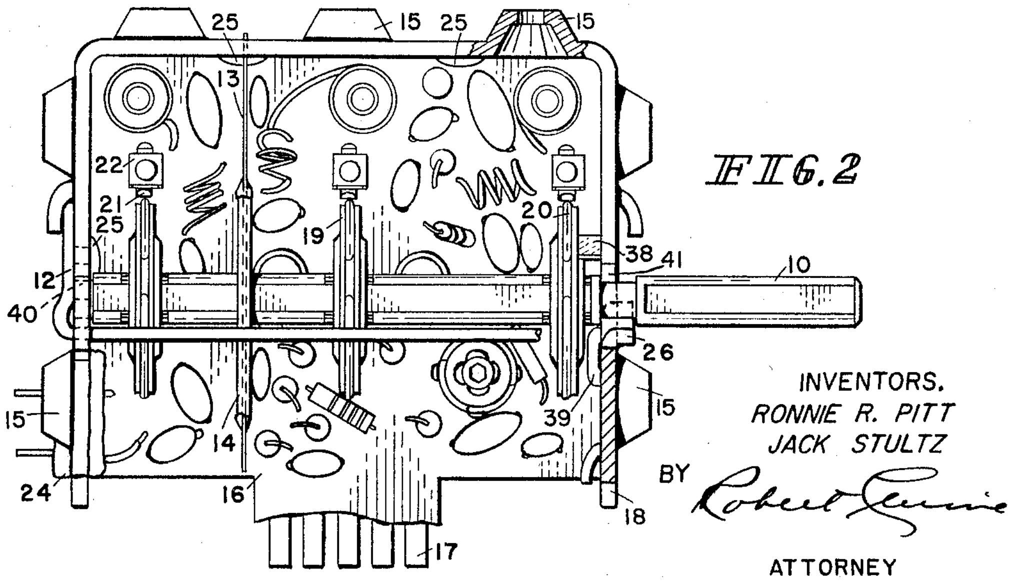
FIG. 2
INVENTORS.
RONNIE R. PITT
JACK STULTZ
BY Robert [signature]
ATTORNEY RADIO FREQUENCY TUNING DEVICE
Filed July 31, 1964 3 Sheets-Sheet 2
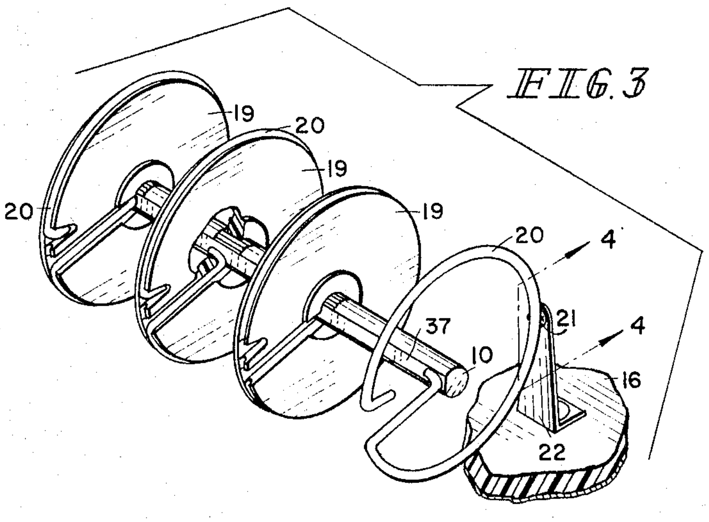
FIG. 3
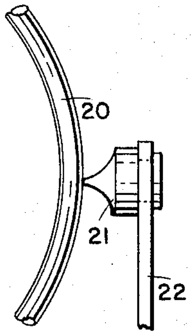
FIG. 4
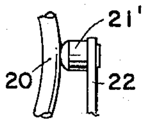
FIG. 4-a
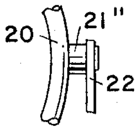
FIG. 4-b
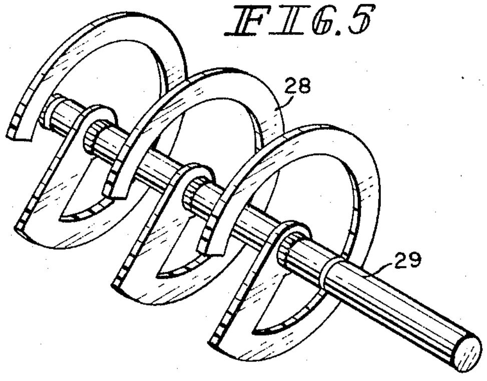
FIG. 5
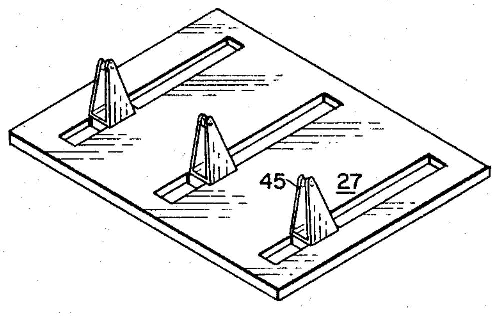
FIG. 6
INVENTORS
RONNIE R. PITT
JACK STULTZ
BY Robert [signature]
ATTORNEY Nov. 8, 1966 R. R. PITT ET AL 3,284,730
RADIO FREQUENCY TUNING DEVICE
Filed July 31, 1964 3 Sheets-Sheet 3
FIG. 7-a
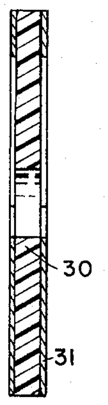
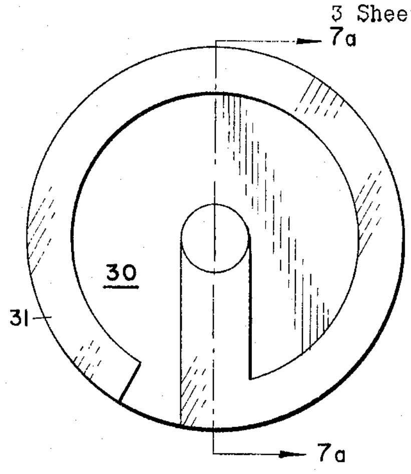
FIG. 7
FIG. 8-a
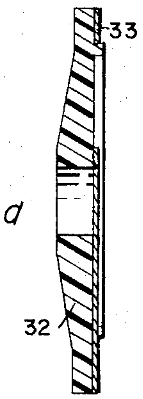
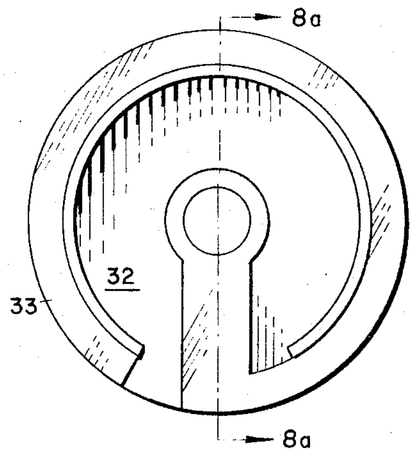
FIG. 8
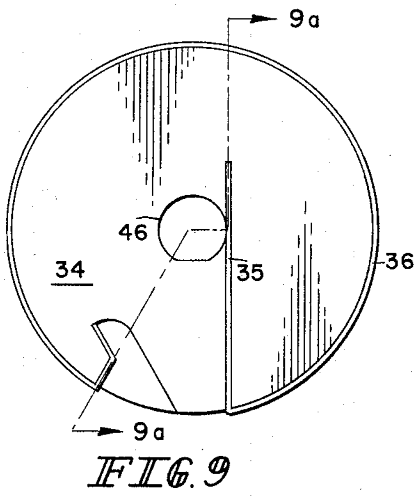
FIG. 9
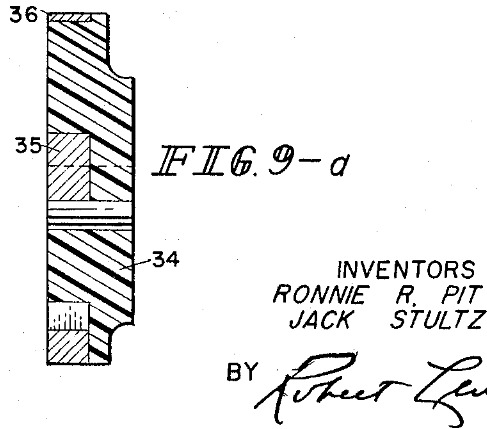
FIG. 9-a
INVENTORS
RONNIE R. PITT
JACK STULTZ
BY Robert [signature]
ATTORNEY 3,284,730

RADIO FREQUENCY TUNING DEVICE

Ronnie R. Pitt and Jack Stultz, Indianapolis, Ind., assignors to P. R. Mallory & Co., Inc., Indianapolis, Ind., a corporation of Delaware Filed July 31, 1964, Ser. No. 386,495
8 Claims. (Cl. 334—72)

The invention is generally relevant to radio wave tuning devices and, more particularly, to tuning means using continuously adjustable inductance.

Many different means have been used for the reception of radio frequency signals and it has been found that each of such means is best suited for a certain frequency range. The AM broadcast band covers a range of 535–1605 kc. and is best tuned by means of a variable capacitor in conjunction with an air or iron-core inductor. Such means are quite satisfactory for frequencies up to about 5000 kc. and down to about 300 kc. but at frequencies higher than 5 mc. tuning is best accomplished by using fixed capacitance and continuously varying the inductance of an air core coil while at frequencies below 300 kc. the use of a fixed capacitance with a variable iron core coil is indicated.

The FM broadcast band extends from 88 to 108 mc. and is particularly well-suited to the use of a continuously variable air inductor type of tuning for reception. A fixed capacitance may be selected of such a value that a single turn coil will provide enough inductance to cover the entire frequency range, thus simplifying the tuning components involved.

It is an object of this invention to make a radio frequency tuner, to cover the 88–108 mc. band of frequencies, which is compact and reliable yet economical to manufacture.

It is another object of this invention to cover the stipulated frequency range with but a single turn, or less, of the tuning shaft.

A further object of this invention is to build a tuner with mounting means provided on several sides to permit a desired orientation between the tuner shaft and the mounting surface.

Still another object of the present invention is to provide an improved tuning coil assembly which will result in a high degree of resetability.

A further object of the present invention is to build a tuner with an access cover that can be removed or replaced without tools and yet provides good radio frequency shielding.

Yet another object of this invention is to provide a one-piece means of preloading both bearing ends of the tuning shaft.

Further objectives of this invention will be apparent by reference to the following description taken in conjunction with the accompanying drawings, forming a part hereof, in which variations of a preferred embodiment have been set forth for illustration.

FIGURE 1 is a perspective view of the tuner with the cover removed and the body cut-away to reveal the tuning coil arrangement.

FIGURE 1–*a* shows details of the shaft spring indicating the relationship between the kinks in the wire and the mating grooves in the shaft.

FIGURE 2 is a top view of the tuner with the cover removed showing, in particular, the rotor assembly with associated contacts.

FIGURE 3 is a perspective view of a rotor assembly with the wire inductor removed from its supporting disk and a typical contact and contact spring shown in cooperating position.

FIGURE 4 is an enlarged view of a section of the wire inductor and the mating contact showing the V-shaped contact configuration.

FIGURE 4–*a* is the same as above but with a spherical-face contact.

FIGURE 4–*b* is the same as above but with a flat-face contact.

FIGURE 5 is a perspective view of a rotor assembly using flat metal stampings as inductors.

FIGURE 6 is a perspective view of a contact assembly for use with stamped metal inductors.

FIGURE 7 illustrates a rotor made from a double copper clad insulative sheet with the undesired copper etched away.

FIGURE 7–*a* is a cross-sectional view of the above rotor.

FIGURE 8 illustrates a rotor using an insulating disk to which a stamped metal inductor is attached by heating the plastic adjacent to the inside circumference of the stamping, thus causing the plastic to overlap the stamping where they are contiguous.

FIGURE 8–*a* is a cross-sectional view of the above rotor.

FIGURE 9 illustrates a rotor using a flat metal strip wrapped around an insulative disk and secured thereto by confinement within notches in the disk.

FIGURE 9–*a* is a cross-sectional view of the above.

Generally speaking, the present invention relates to a continuously variable tuning device of the inductance type. In accordance with a preferred embodiment of this invention, the tuning element consists of less than a single turn of wire secured in a groove around the outside surface of an insulative disk. One end of this wire extends radially from the outside edge of the disk to the center hole therein and is connected to the shaft when the latter is pressed into the center hole. The other end of the wire is secured within a slot in the disk. The insulative disk is molded, preferably, so that the slots and rotary stops may be had economically. Contact to the wire is provided by a silver contact secured to the end of a metallic spring arm cantilevered from the circuit board. The contact face may be flat, spherical or V-shaped; the flat face contact will increase the life expectancy while the V-shaped contact will provide better resetability; the spherical contact is a compromise.

The preferred embodiment of this tuner uses a silver plated copper wire wrapped around the rotor rather than stamped, etched, or flat wrap-around inductors because of the improved qualities of the former. Drawing the wire through a series of draw-dies improves the surface to a high degree while the other inductors discussed would require expensive polishing operations to approach the same degree of smoothness. This super-smoothness reduces contact wear and tuning adjustment noise. As the shaft acts as a common impedance to the low potential side of the rotor inductors, over-coupling effects are solved by inserting a shield ground spring over the shield separating the two cavities of the tuner and thus substantially confining the radio frequency energy in the antenna cavity to that section of the tuner.

The preferred embodiment of this invention is most clearly shown in FIGURES 1, 1–*a* and 2. The body 18 of the tuner consists of a metal U-shaped channel with open front, top and bottom, the back having three bosses 15 for mounting the tuner, left and right end sections each with 3 mounting bosses 15, and with bearing slots 40–41 for the rotor shaft 10. Both end walls are lanced towards each other so as to provide virtual grooves 25 into which the printed circuit board 16 may be inserted. This printed circuit board 16 has mounted on it coupling, bypassing, and trimming capacitors, resistors, transistors, coils, a diode, a varactor, etc.

The printed circuit board 16 has a projecting section which has, on one side, parallel conductive strips 17 emanating from the board circuitry which serve as a plug-in connector for attachment to external circuits such as ground, D.C. power source, automatic frequency control (AFC), automatic volume control (AVC), and intermediate frequency (IF) amplifier. This construction simplifies the problem of attaching the tuner to a test fixture for adjustment and alignment as no loose leads must be connected for testing.

The right end of the tuner body 18 has a slot 41 extending from the top to the center, and of a width slightly greater than the diameter of the grooves in the shaft 10. The end of the slot 41 terminates in a bearing surface formed by bending a tab 26 from the portion of the tuner body adjacent to the end of the slot 41 so the smooth metal surface closes the end of the slot. The shaft wire 12 urges the shaft 10 against the bearing tab 26 with such force that the rotor assembly will not become displaced from mechanical shocks imposed on the tuner yet permitting the shaft to be turned with moderate torque. The other end of the shaft 10 is also supported by a similar tab 26 and tensioned by the other end of the shaft wire 12.

An insulated two-wire connector 24 is inserted into a slot in the left body side, as shown in FIGURE 1, and soldered into the circuit for connection to the antenna.

There are several ingenious features that simplify the assembly of the components comprising this tuner and a discussion of the assembly of a preferred embodiment is indicated here.

Components such as resistors and semiconductor devices; by-pass, coupling, and trimming capacitors; coils, and shields are inserted into the printed circuit board 16 and solder-dipped. The board 16 is inserted into the groove 25 until it butts against the back portion of the body 18 whereat it is soldered.

FIGURES 3 and 4 indicate how the rotor subassembly is made by molding a disk 19 of low-loss plastic so as to partially imbed the wire inductor 20 around the circumference of that disk. The center of the disk is reinforced with an integral hub through the center of which is an axial round hole with one end of the wire inductor 20 projecting therein. The tuner shaft 10 is pressed through the hole in the hub of the disk 19 so that the longitudinal groove 37 in the shaft 10 coincides with the inside end of the wire inductor 20. All inductors are thus connected together through the common shaft 10. The disks 19 are spaced so that each wire inductor 20 is positioned directly opposite its cooperating contact 21. The contact face may be V-shaped 21 as shown in detail in FIGURE 4 or convex 21′ as shown in FIGURE 4–*a* or flat 21″ as in FIGURE 4–*b*.

An integral stop 38 is molded on a face of the plastic rotor and butts against a lanced ear 39 projecting from the right end of the body. Thus, by varying the arcuate length of the molded stop 38, shaft rotation of about 360° or less is readily achieved.

While the invention described represents a preferred embodiment, there are several modifications of merit as described herewith.

FIGURE 5 pictures a tuning element 28 composed of a stamped, flat metal ring forming an incomplete circle less than 360° extent. Connection to one end of the inductor is made by an integral radial member terminating in an integral hub pierced to accommodate shaft 29.

FIGURE 6 displays an insulative board 27 with contact clips 45 mounted thereon. This board 27 is located so the inductors 28 pass between the jaws of the contact clips 45 as the shaft 29 is rotated, thus effectively varying the inductance between the contact clips 45 and the common shaft 29.

Another variation of this invention is shown in FIGURES 7 and 7–*a*. This comprises an insulative disk 30 to which is attached a metal inductor 31. This can be achieved by printed circuit etching techniques or, conversely, by electroless plating.

Still another variation of this invention is shown in FIGURES 8 and 8–*a*. The rotor 32 is a molded plastic disk with a recess around the outer edge to receive a flat incomplete ring inductor 33. It is securely held in place by heat-staking the contiguous plastic disk 32, thus causing the plastic to flow slightly and overlap the adjacent ring inductor 33.

Yet another variation of this invention is pictured in FIGURES 9 and 9–*a*. A molded plastic disk 34 is provided with a narrow slot which is tangent to the shaft hole 46. A thin conductive ribbon 36 is inserted in that slot 35 and wound around the periphery of the disk and terminated in a notch.

The left end of the body 18 has a slot 40 leading to a shaft bearing 26 so the end of the shaft 10 of the rotor assembly may be tilted and inserted in that slot 40. The right end of the rotor assembly is passed through the open slot 41 of the right end of the tuner body 18, and pushed against the shaft bearings 26. As the rotor assembly is being pushed into its fixed position, the contact springs 22 are deflected against the wire inductors 20 to provide proper contact force. The shield ground spring 14 is inserted over the shield 13 and soldered thereto. The shaft wire 12 is assembled as shown in FIGURE 1 and FIGURE 1–*a* so the end-play of the rotor assembly is virtually eliminated.

Cover 11 is placed over the body assembly and the hook-shaped tab passed through slot 23 by depressing the cover at that point. The opposite end of the cover is secured to the circuit board supporting lances forming a virtual groove 25 by pressing the cover towards the rear of the assembly sufficiently to allow the two hooks on the cover to drop into those lances.

The cover 11 is made with the outside edges formed inwardly, slightly, with resulting spring pressure to the body 18 thus decreasing contact resistance and improving the shielding characteristics.

The large holes in the cover 11 provide access to the trimming coils on one side and to the trimming capacitors on the opposite side. This type of construction insures accurate adjustment of the circuits which would not be the case were it necessary to remove the cover for adjusting.

The present invention of the tuner assembly described herewith is intended to be illustrative and not exhaustive in scope inasmuch as many different embodiments are possible within the scope of the following claims.

We claim:

1. A tuner assembly for accepting very high frequency signals comprising a body, a circuit board within said body, said circuit board having mounted thereon components required to convert said very high frequency signals to an intermediate frequency, said circuit board having plug-connector means for connection to external circuitry, a circular inductor spanning an arc less than 360°, said inductor revolvable by means of a shaft coupled thereto, a contact pressing against the periphery of said inductor so that rotation of said shaft causes a variation of inductance between said shaft and said contact, a partial shield partitioning said body, said shield augmented by a shield ground spring inserted over said shield, said shield ground spring extending into and contacting a groove on said shaft, an insulator with feed-through conductors therein for input signals attached to said body, a U-shaped shaft wire with the base portion bridging the entire body, the sides of said shaft wire fitting into grooves of said shaft and biased thereagainst to force said shaft against bearings made by lancing and forming tabs from said body, and a U-shaped cover pierced by circuit adjusting holes and with protruding tabs for fastening said cover to said body without the use of tools.

2. A tuner assembly for accepting very high frequency signals comprising a body, a printed circuit board within said body, said printed circuit board having mounted thereon components required to convert said very high frequency signals to an intermediate frequency, said printed circuit board having plug-in means for connection to external circuitry including a direct current source, a circular inductor spanning an arc of less than 360°, said inductor being conductively attached to a tuning shaft, a contact arm fastened to said printed circuit board, and forcibly contacting said inductor so rotation of said shaft causes said inductor to slidably make contact with said inductor causing a variation of inductance between said shaft and said contact arm, a partial shield partitioning the cavity formed by said end walls into a major and a minor cavity, said shield ground spring having integral fingers extending into a groove on said shaft, each of said fingers biased against the sides of said groove, a molded insulator with wire leads therein for input signals slidably inserted into said end wall, a U-shaped shaft wire with the base portion extending the full length of said body, the sides of said shaft wire fitting into grooves of said shaft and biased thereagainst to urge said shaft against bearings lanced-out of side walls and a metallic cover pierced with holes for access to adjustable components and with protruding tabs for fastening said cover to said body without the use of tools.

3. A tuner assembly for accepting very high frequency signals comprising a body, a printed circuit board within said body, said printed circuit board having mounted thereon components required to convert said very high frequency signals to an intermediate frequency, said printed circuit board having plug-in means for connection to external circuitry, a circular inductor spanning an arc less than 360°, said inductor revolvable by means of a shaft coupled thereto, a contact spring-loaded against the periphery of said inductor so that rotation of said shaft causes a variation of inductance between said shaft and said contact, a partial shield partitioning said body, said shield augmented by a shield ground spring inserted over said shield, said shield ground spring extending into a groove on said shaft, an insulator with conductors therein for input signals attached to said body, a U-shaped shaft wire with the base portion bridging the entire body, the sides of said shaft wire fitting into grooves of said shaft and biased thereagainst to press said shaft against bearings made by lancing and forming tabs from said body, and a U-shaped cover pierced by circuit adjusting holes and with protruding tabs for fastening said cover to said body without the use of tools.

4. A tuner assembly for accepting very high frequency signals comprising a body consisting of a rear wall and end walls, a printed circuit board insertable within said body, said printed circuit board having mounted thereon components required to convert said very high frequency signals to an intermediate frequency, said printed circuit board projecting beyond the confines of said body, parallel printed circuit conductive strips thereon, said conductive strips connected to said printed circuit board circuitry for the introduction of external circuitry, a circular stamped inductor spanning an arc of less than 360°, said inductor having an integral arm extending radially to an integral hub through the center of which passes a tuning shaft, a U-shaped contact arm cantilevered from said printed circuit board with the ends biased against each other, said stamped inductor located between said contact arms so rotation of said shaft causes said stamped inductor to revolve between said contact arms thus varying the effective inductance, a partial shield partitioning the cavity formed by said end walls into a major and a minor cavity, said shield completed by a shield ground spring inserted over said shield, said shield ground spring having integral fingers extending into a groove on said shaft, each of said fingers biased against the sides of said groove, a molded insulator with wire leads therein for input signals slidably inserted into said end wall, a U-shaped shaft wire with the base portion bridging the body from one end wall to the other end wall, the sides of said shaft wire fitting into grooves of said shaft and biased thereagainst to press said shaft against bearings made by lancing and forming tabs from said end walls, and a U-shaped cover with protruding tabs for fastening said cover to said body without the use of tools, and said cover being pierced by various holes to provide access to adjustable components of said tuner.

5. A tuner assembly for accepting very high frequency signals comprising a body consisting of a U-shaped channel with a rear wall and end walls, a printed circuit board slidably insertable within said body, said printed circuit board having mounted thereon reactive, active, and resistive components to amplify and convert said very high frequency signals to an intermediate frequency, said printed circuit board having a projecting portion with parallel conductive strips thereon, said conductive strips connected to said printed circuit board circuitry to accommodate the introduction of external circuitry, a plastic rotor on a conductive tuning shaft, said rotor supporting on its periphery a ribbon inductor spanning less than 360°, one end of said ribbon inductor making contact with said shaft, a contact arm cantilevered from said printed circuit board, a contact secured to the free end of said contact arm, said contact arm biased towards said shaft and urging said contact against said ribbon inductor, a partial shield partitioning the cavity formed by said end walls into a major and a minor cavity, said shield completed by a shield ground spring inserted over said shield, said shield ground spring having integral fingers extending into a groove on said shaft, each of said fingers biased against the sides of said groove, a molded insulator with wire leads therein for input signals slidably inserted into said end wall, a U-shaped shaft wire with the base portion bridging the body from one end-wall to the other end-wall the sides of said shaft wire fitting into grooves of said shaft and biased thereagainst to urge said shaft against bearings made by lancing and forming tabs from said end-walls, and a U-shaped cover pierced with component adjusting holes and with protruding integral hooks for fastening said cover to said body without the use of tools.

6. A tuner assembly for accepting very high frequency signals comprising a body consisting of a U-shaped channel with a rear wall and end walls, a printed circuit board slidably insertable within said body, said printed circuit board having mounted thereon reactive, active, and resistive components to amplify and convert said very high frequency signals to an intermediate frequency, said printed circuit board having a projecting portion with parallel conductive strips thereon, said conductive strips connected to said printed circuit board circuitry to accommodate the introduction of external circuitry, a plastic rotor on a conductive tuning shaft, said rotor supporting on its periphery a wire inductor spanning less than 360°, one end of said inductor making contact with said shaft, a contact arm cantilevered from said printed circuit board, a contact button secured to the free end of said contact arm, said contact arm biased towards said shaft and urging said contact against said wire inductor, said contact button V-shaped with the blade parallel to the longitudinal axis of said shaft, a partial shield partitioning the cavity formed by said end walls into a major and a minor cavity, said shield completed by a shield ground spring inserted over said shield, said shield ground spring having integral fingers extending into a groove on said shaft, each of said fingers biased against the sides of said groove, a molded insulator with wire leads therein for input signals slidably inserted into said end wall, a U-shaped shaft wire with the base portion bridging the body from one end-wall to the other end-wall the sides of said shaft wire fitting into grooves of said shaft and biased thereagainst to urge said shaft against bearings made by lancing and forming tabs from said end-walls, and a U-shaped cover with protruding integral hooks for fastening said cover to said body without the use of tools, said cover being pierced by various holes to provide access to adjustable components of said tuner.

7. A tuner assembly according to claim 6, wherein said contact button is flat-faced.

8. A tuner assembly according to claim 6, wherein said contact button is spherically-faced.

References Cited by the Examiner

UNITED STATES PATENTS

| | | | |
|---|---|---|---|
| 2,498,529 | 2/1950 | Clark | 333—82 |
| 2,503,582 | 4/1950 | Ginsburg | 336—139 |
| 2,543,560 | 2/1951 | Thias | 336—149 X |
| 2,711,518 | 6/1955 | Perelstrus | 336—149 |
| 2,734,175 | 2/1956 | Wasmansdorff | 333—82 |
| 2,759,158 | 8/1956 | Puerner et al. | 333—82 |
| 2,798,161 | 7/1957 | Finke | 333—82 |
| 2,834,948 | 5/1958 | Pan et al. | 334—43 |
| 3,001,069 | 9/1961 | Hubbard | 333—82 |
| 3,016,505 | 1/1962 | Collins | 334—85 X |
| 3,172,062 | 3/1965 | Valdettaro et al. | 334—51 |

HERMAN KARL SAALBACH, *Primary Examiner.*

R. F. HUNT, *Assistant Examiner.*